United States Patent
Cheng et al.

(10) Patent No.: US 9,075,182 B2
(45) Date of Patent: Jul. 7, 2015

(54) CAMERA MODULE AND SPACER OF A LENS STRUCTURE IN THE CAMERA MODULE

(75) Inventors: Chieh-Yuan Cheng, Hsinchu (TW); Hung-Yeh Lin, Yilan County (TW)

(73) Assignees: VisEra Technology Company Limited, Hsinchu (TW); OmniVision Technologie, Inc., Santa Clara, CA (US)

( * ) Notice: Subject to any disclaimer, the term of this patent is extended or adjusted under 35 U.S.C. 154(b) by 370 days.

(21) Appl. No.: 13/152,690

(22) Filed: Jun. 3, 2011

(65) Prior Publication Data
US 2012/0307139 A1 Dec. 6, 2012

(51) Int. Cl.
H01L 27/146 (2006.01)
G03B 17/12 (2006.01)
G02B 7/02 (2006.01)
G02B 7/00 (2006.01)

(52) U.S. Cl.
CPC . *G02B 7/02* (2013.01); *G03B 17/12* (2013.01); *G02B 7/003* (2013.01); *G02B 7/021* (2013.01); *H01L 27/14618* (2013.01); *H01L 27/14625* (2013.01)

(58) Field of Classification Search
CPC ..... G03F 7/00; H01L 21/0338; H01L 2/0337; H01L 21/76831; H01L 51/5246; H01L 51/525; H01L 21/28141; H01L 21/2815
USPC .............. 348/340, 374; 257/98–99, 435, 437, 257/659; 438/65, 68, 25, 29
See application file for complete search history.

(56) References Cited

U.S. PATENT DOCUMENTS 7,763,841 B1 * 7/2010 McEldowney ................. 250/216
8,837,060 B2 * 9/2014 Lin et al. ........................ 359/740
2008/0090168 A1 * 4/2008 Kim et al. ...................... 430/154
2009/0121300 A1 * 5/2009 Voelz .............................. 257/432
2009/0225431 A1 * 9/2009 Lee ................................. 359/621
2009/0256931 A1 * 10/2009 Lee et al. ................... 348/231.99
2009/0309177 A1 12/2009 Jeung et al.
2010/0102437 A1 * 4/2010 Suto .............................. 257/692
2011/0149143 A1 * 6/2011 Tsujino ......................... 348/374
2012/0218648 A1 * 8/2012 Lin et al. ....................... 359/715

FOREIGN PATENT DOCUMENTS

CN 102103250 A 6/2011
WO WO 2009/137022 A1 11/2009

OTHER PUBLICATIONS

TW Office Action dated Nov. 21, 2014 from corresponding TW Appl.
Office Action issued on Jul. 14, 2014 by the Chinese Patent Office in corresponding CN Patent Application No. 201110274849.4.

* cited by examiner

*Primary Examiner* — Pritham Prabhakher
(74) *Attorney, Agent, or Firm* — Muncy, Geissler, Olds & Loew, P.C.

(57) ABSTRACT

A camera module and a fabrication method thereof are provided. The camera module includes a lens structure and an image sensor device chip disposed under the lens structure. The lens structure includes a transparent substrate and a lens disposed on the transparent substrate. A spacer is disposed on the transparent substrate to surround the lens, wherein the spacer contains a base pattern and a dry film photoresist. The method includes forming a base pattern on a carrier and attaching a dry film photoresist on the carrier. The dry film photoresist is planarized by a lamination process and then patterned to form a spacer. A transparent substrate having a plurality of lenses is provided. The spacer is stripped from the carrier, attaching on the transparent substrate to surround each of the lenses, and then bonded with image sensor device chips.

10 Claims, 7 Drawing Sheets

CAMERA MODULE AND SPACER OF A LENS STRUCTURE IN THE CAMERA MODULE

BACKGROUND OF THE INVENTION

1. Field of the Invention

The invention relates to a camera module and more particularly to a spacer of a lens structure in the camera module and a method for fabricating the spacer, and the height of the spacer is adjustable according to the fabrication method.

2. Description of the Related Art

In conventional camera modules, a lens structure is disposed over an image sensor device. The lens structure comprises a lens for adjustment of incident light, so that the image sensor device can capture an image more effectively. Moreover, the lens structure further comprises a spacer surrounding the lens to control a distance between the lens and the image sensor device for optimum optical performance of the camera modules.

In a conventional method, the spacer is fabricated by drilling a glass substrate. Because the thickness of the glass substrate is fixed, the thickness of the spacer formed by drilling the glass substrate cannot be adjusted. In another conventional method, the spacer is fabricated by exposing and developing a photoresist. Because the thickness of the photoresist is fixed, the thickness of the spacer formed by exposing and developing the photoresist cannot be adjusted. Thus, the thickness of the spacer fabricated by the conventional method cannot be adjusted for optimum optical performance of camera modules.

Therefore, a camera module capable of overcoming the above problems to form a spacer having an adjustable height is desired.

BRIEF SUMMARY OF THE INVENTION

A camera module and a method for fabricating a camera module are provided, wherein a height of a spacer of a lens structure of the camera module is adjustable through a volume of a base pattern in the spacer, a pattern density of the base pattern and a thickness of a dry film photoresist in the spacer.

An exemplary embodiment of the camera module comprises a lens structure and an image sensor device chip disposed under the lens structure. The lens structure includes a transparent substrate having a first surface and a second surface opposite to the first surface. A lens is disposed on the first surface of the transparent substrate. A spacer is disposed on the first surface of the transparent substrate to surround the lens, wherein the spacer contains a base pattern and a dry film photoresist.

In an exemplary embodiment, a method for fabricating a camera module is provided. The method comprises providing a carrier and forming a base pattern on the carrier. A dry film photoresist is attached on the carrier and the base pattern. A lamination process is performed to planarize the dry film photoresist. Then, the dry film photoresist is patterned to form a spacer. A transparent substrate having a plurality of lenses is provided. The spacer is stripped from the carrier and then the spacer is attached on the transparent substrate to surround each of the lenses. Then, a plurality of image sensor device chips is bonded under the lenses.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
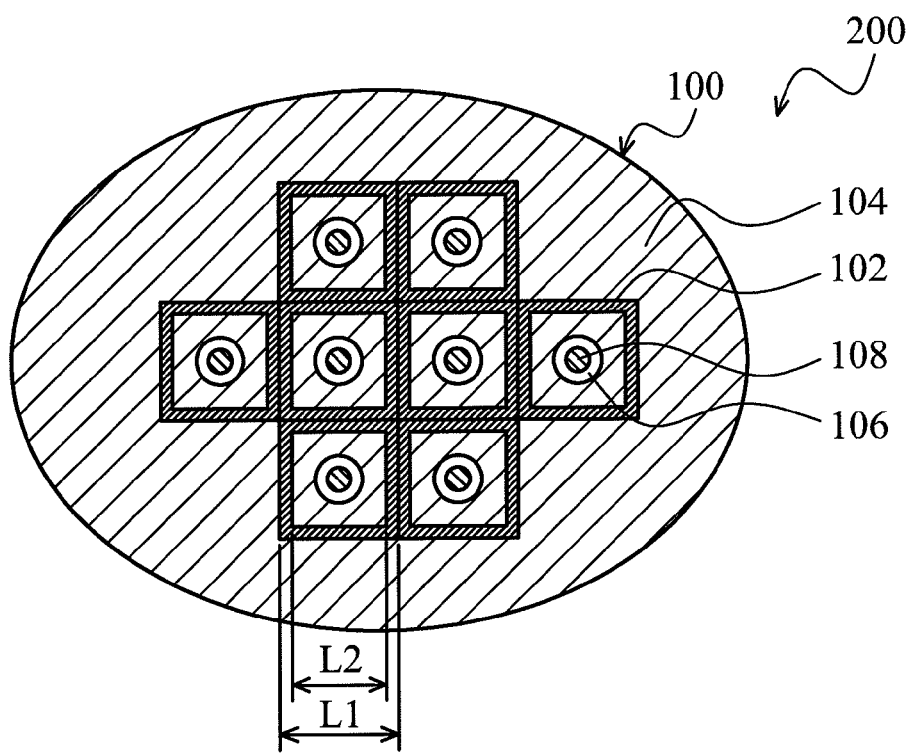
FIG. 1 shows a schematic plane view of a lens structure for a camera module according to an embodiment of the invention.

An exemplary embodiment of the invention provides a lens structure for a camera module, wherein the lens structure includes a spacer having an adjustable height. FIG. 1 shows a plane view of a lens structure 200 for a camera module according to an embodiment of the invention. A base pattern 102 is disposed on a transparent substrate 100, for example a glass substrate. The base pattern 102 includes a plurality of rectangular rings which are connected with each other. A dry film photoresist 104 is disposed on the transparent substrate 100 and covers the base pattern 102. The dry film photoresist 104 is patterned to have a plurality of openings 106 to expose portions of the transparent substrate 100. The base pattern 102 and the dry film photoresist 104 are combined to form a spacer of the lens structure 200. A plurality of lenses 108 is disposed on the transparent substrate 100. Each of the lenses 108 is disposed in each of the openings 106 and is surrounded by the spacer of the lens structure 200. The shape of the lens 108, the opening 106 and the rectangular ring of the base pattern 102 are concentric.

Today's trend in camera-equipped products demands miniaturization; therefore, it requires dry film photoresist to replace the glass in the spacer manufacturing for size reduction. Dry film photoresist is a photosensitizing material used in photolithography to form precision patterns and provides excellent conformity that allows lamination for a multilayer configuration with the desired thickness. The seamless interfaces between dry film photoresist layers can be achieved by selecting dry film formulation with superior adhesion and applying proper manufacturing processes.

If dry film photoresist is processed below 75 degree Celsius for the steps of lamination, exposure, development, and so forth, the dry film photoresist stays wherever it is placed instead of entering any unprotected, unenclosed, or unoccupied space. That is, dry film photoresist below this temperature is not able to flow. Consequently, solvents can easily strip the dry film photoresist afterwards; no residue will be left in any unprotected, unenclosed, or unoccupied space. On the contrary, dry film photoresist processed above 75 degree Celsius will refer to certain of the movement characteristic of fluids. Cure or a curing process is applied afterwards to the moved and distributed dry film photoresist and the cured dry film photoresist will be hardened but not be removed by solvents.

In the embodiment of the invention, the dry film photoresist 104 has a movement characteristic at a temperature of above 75° C. of a lamination process. During the lamination process, the dry film pattern 104 is planarized. Thus, an increasing thickness of the dry film photoresist 104 on the base pattern 102 is determined by a volume of the base pattern 102, a pattern density of the base pattern 102 and an original thickness of the dry film pattern 104 before the lamination process. When the volume of the base pattern 102 is increased, the height of the spacer is increased. When the pattern density of the base pattern 102 is increased, the height of the spacer is increased. When the original thickness of the dry film pattern 104 is increased, the height of the spacer is increased.

Thus, according to the embodiment of the invention, a height of the spacer which is formed from the base pattern 102 and the dry film photoresist 104 is adjustable before a UV curing process is performed to the spacer. In order to adjust the height of the spacer, a special base pattern 102 is used for adjusting the thickness of the dry film photoresist 104 on the special base pattern 102 during the lamination process. Accordingly, the embodiments of the invention provide spacers having various heights for lens structures of a camera module and the heights of the spacers can be fine adjusted by the design of the base pattern to achieve optimum optical performance for the camera modules.

In an exemplary example, referring to FIG. 1, the base pattern 102 has an outside length L1 of about 4320 µm and an inside length L2 of about 4098 µm. A thickness of the base pattern 102 is about 50 µm and an original thickness of the dry film photoresist 104 is about 100 µm. After a lamination process, an increased thickness of the dry film photoresist 104 on the base pattern 102 is about 5 µm. In another exemplary example, referring to FIG. 1 again, the base pattern 102 has an outside length L1 of about 4320 µm and an inside length L2 of about 3864 µm. A thickness of the base pattern 102 is about 50 µm and an original thickness of the material layer of the dry film photoresist 104 is about 100 µm. After a lamination process, an increased thickness of the dry film photoresist 104 on the base pattern 102 is about 10 µm. Thus, according to an embodiment of the invention, the increased thickness of the dry film photoresist 104 on the base pattern 102 can be adjusted through changing of the inside length of the base pattern 102. Further, according to the embodiments of the invention, the height of the spacer of the lens structure can be fine adjusted through the design of the base pattern.

Figure 2:
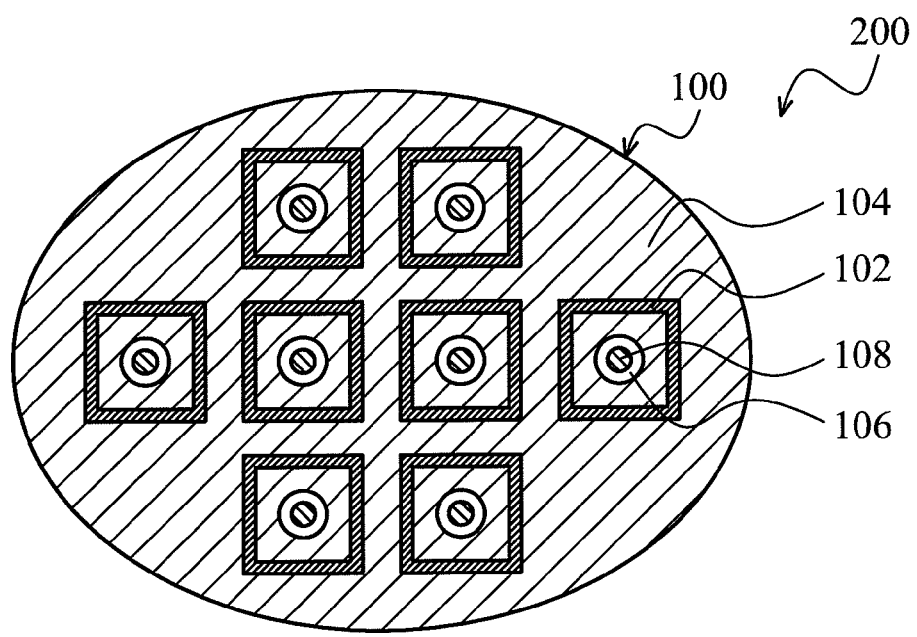
FIG. 2 shows a schematic plane view of a lens structure for a camera module according to an embodiment of the invention.

FIG. 2 shows a plane view of a lens structure 200 for a camera module according to an embodiment of the invention, wherein the base pattern 102 includes a plurality of rectangular rings which are separated from each other. The shape of each of the lenses 108, each of the openings 106 of the dry film photoresist 104 and each of the rectangular rings of the base pattern 102 are concentric. The base pattern 102 and the dry film photoresist 104 are combined to form a spacer of the lens structure 200. Similarly, a height of the spacer of the lens structure 200 is adjustable before performing a UV curing process on the dry film photoresist 104. Thus, the height of the spacer of the lens structure 200 can be adjusted by the design of the base pattern 104 to achieve optimum optical performance for the camera module.

Figure 3:
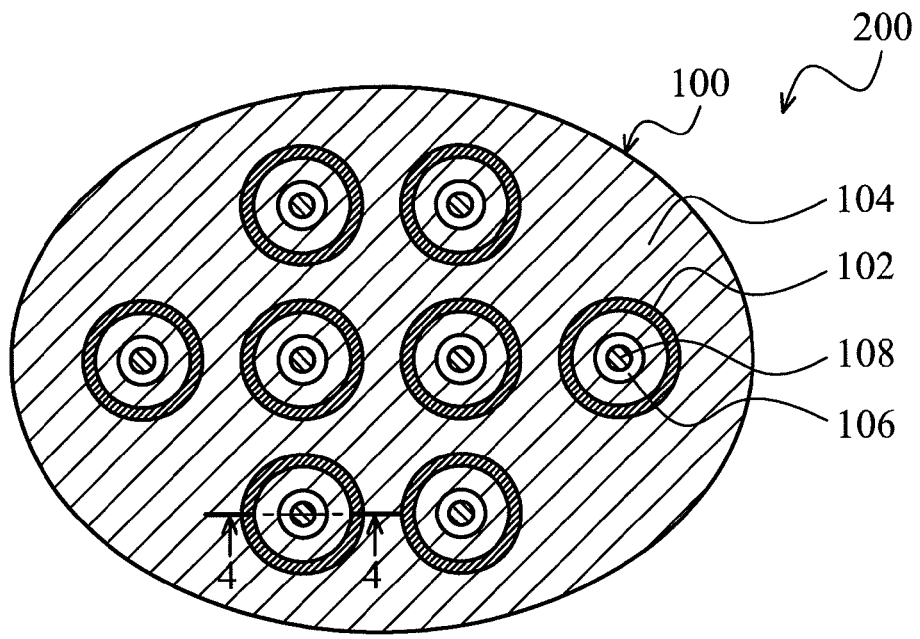
FIG. 3 shows a schematic plane view of a lens structure for a camera module according to an embodiment of the invention.

FIG. 3 shows a plane view of a lens structure 200 for a camera module according to an embodiment of the invention, wherein the base pattern 102 includes a plurality of circular rings which are separated from each other. Each of the lenses 108, each of the openings 106 of the dry film photoresist 104 and the shape of each of the circular rings of the base pattern 102 are concentric. The base pattern 102 and the dry film photoresist 104 are combined to form a spacer of the lens structure 200. Because the dry film photoresist 104 has a planarized property during a lamination process, a height of the spacer of the lens structure 200 is adjustable before performing a UV curing process on the dry film photoresist 104. Thus, the height of the spacer of the lens structure 200 can be adjusted by the design of the base pattern 104 to achieve optimum optical performance for the camera module.

Figure 4:
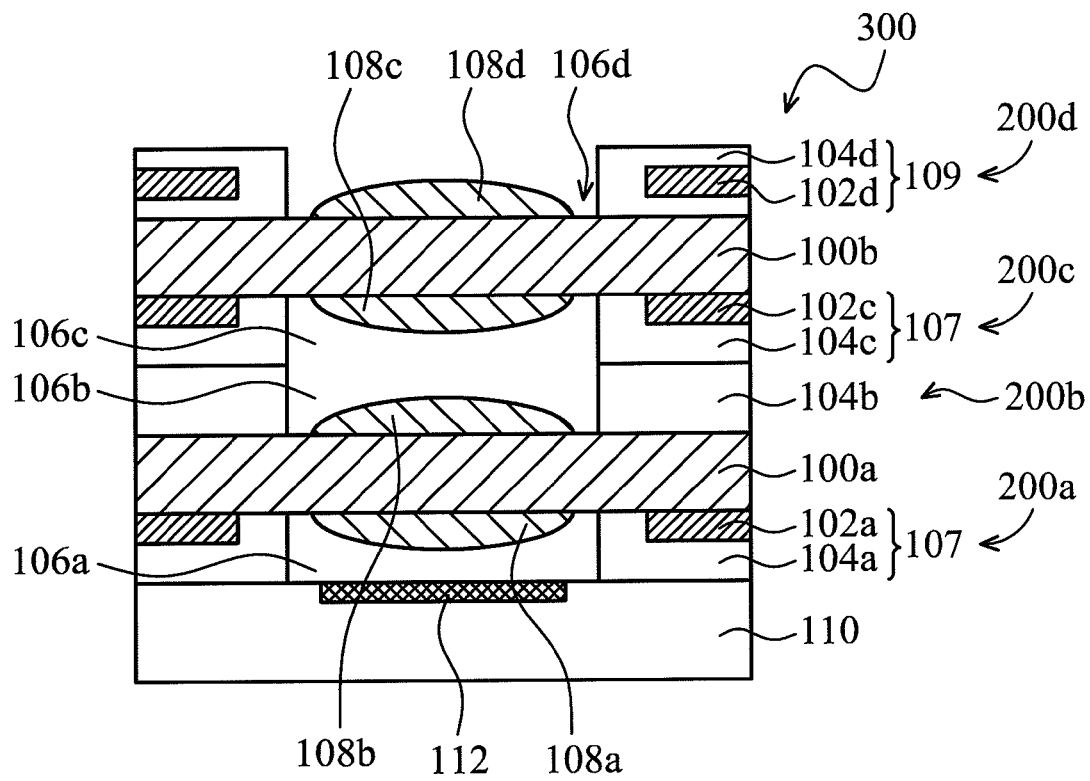
FIG. 4 shows a schematic cross section of a camera module along a dotted line 4-4' of FIG. 3 according to an embodiment of the invention.

FIG. 4 shows a cross section of a camera module 300 along a dotted line 4-4' of FIG. 3 according to an embodiment of the invention. The camera module 300 includes four lens structures 200a, 200b, 200c and 200d disposed over an image sensor device chip 112 that is formed on a semiconductor substrate 110, such as a wafer. Although the camera module 300 of FIG. 4 is illustrated with four lens structures, other amounts of lens structures can also be used for the camera module 300. The first lens structure 200a includes a spacer 107 disposed on a bottom surface 100B of a first transparent substrate 100a and a lens 108a surrounded by the spacer 107. The spacer 107 is formed from a base pattern 102a and a dry film photoresist 104a. The spacer 107 has an opening 106a and the lens 108a is disposed in the opening 106a.

The second lens structure 200b includes a spacer 104b disposed on an upper surface 100A of the first transparent substrate 100a and a lens 108b surrounded by the spacer 104b. The spacer 104b is formed from a dry film photoresist. The spacer 104b has an opening 106b and the lens 108b is disposed in the opening 106b.

The third lens structure 200c includes a spacer 107 disposed on a bottom surface 100B of a second transparent substrate 100b and a lens 108c surrounded by the spacer 107. The spacer 107 of the third lens structure 200c is formed from a base pattern 102c and a dry film photoresist 104c. The spacer 107 has an opening 106c and the lens 108c is disposed in the opening 106c.

The fourth lens structure 200d includes a spacer 107 disposed on an upper surface 100A of the second transparent substrate 100b and a lens 108d surrounded by the spacer 109. The spacer 109 is formed from a base pattern 102d and a dry film photoresist 104d. The spacer 109 has an opening 106d and the lens 108d is disposed in the opening 106d. In the spacer 109 of the fourth lens structure 200d, the base pattern 102d is embedded in the spacer 109.

The four lens structures 200a, 200b, 200c and 200d are bonded together to form a lens element, and then the lens element is bonded with the semiconductor substrate 110 which has the image sensor device chip 112 formed thereon. Although the camera module 300 of FIG. 4 shows one image sensor device chip 112 and each lens structure shows one lens, the lens element can be fabricated at a wafer level scale process and bonded with a wafer having a plurality of image sensor device chips thereon. Then, the lens element and the wafer are diced to separate the image sensor device chips 112 to form the camera module 300 as shown in FIG. 4.

According to the embodiments of the invention, the base pattern can be used in the spacer of any of the lens structures to adjust the height of the spacer for various lenses. Although the base pattern and the dry film photoresist have fixed original thicknesses, the final height of the spacer formed from the base pattern and the dry film photoresist can be fine adjusted by the design of the base pattern, such as a volume of the base pattern, a pattern density of the base pattern on a carrier and a thickness of the dry film photoresist.

Figure 5A:
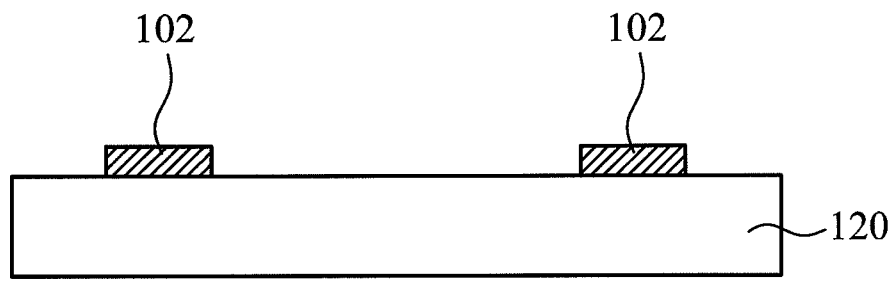
FIGS. 5A-5F show cross sections of intermediate stages of fabricating a lens structure according to an embodiment of the invention.

FIGS. 5A-5F show cross sections of intermediate stages of fabricating a lens structure 200a or 200c according to an embodiment of the invention. Referring to FIG. 5A, a carrier 120 is provided. The carrier 120 is for example a polymer film and a formed spacer can be stripped from the carrier 120. A material layer (not shown) of the base pattern 102, for example a dry film type photoresist is disposed on the carrier 120. Then, the material layer is patterned by an exposure and a development process to form the base pattern 102 on the carrier 120.

Figure 5B:
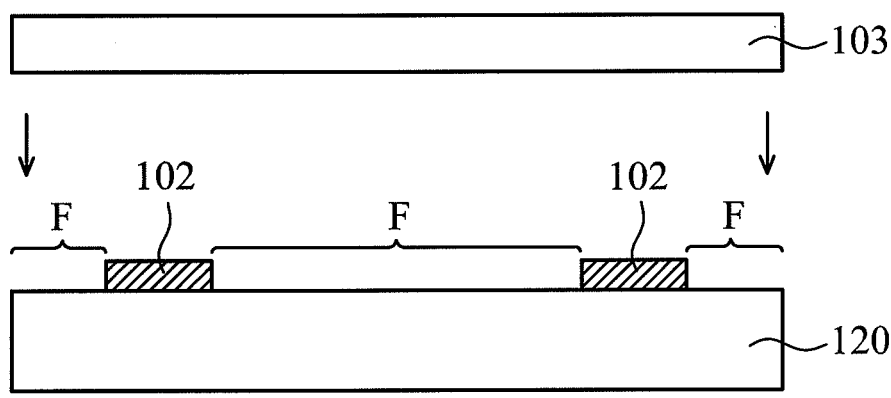

Referring to FIG. 5B, a dry film photoresist 103 is attached on the base pattern 102 and the carrier 120. In an embodiment, the material of the dry film photoresist 103 may be the same as that of the base pattern 102. In another embodiment, the material of the dry film photoresist 103 may be different from the material of the base pattern 102.

Figure 5C:
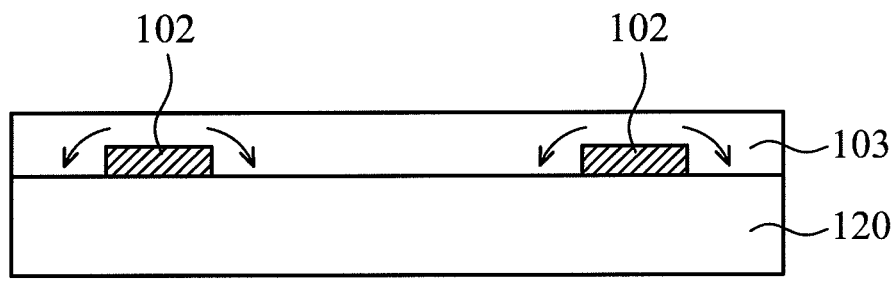

Referring to FIG. 5B and 5C, the dry film photoresist 103 is planarized by a lamination process. An exposed surface F of the carrier 110 for the lamination of the dry film photoresist 103 is shown in FIG. 5B, which is not occupied by the base pattern 102.

Figure 5D:
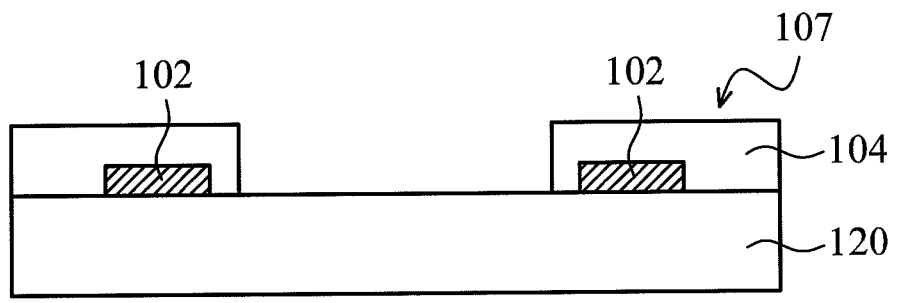

Referring to FIG. 5D, after the lamination process, the dry film photoresist 103 is patterned by an exposure and a development process to form a dry film photoresist pattern 104 having an opening. The dry film photoresist pattern 104 covers the sidewalls and the top surface of the base pattern 102. The base pattern 102 and the dry film photoresist pattern 104 are combined to form a spacer 107 of the lens structure, wherein the height of the spacer 107 is adjustable.

Figure 5E:
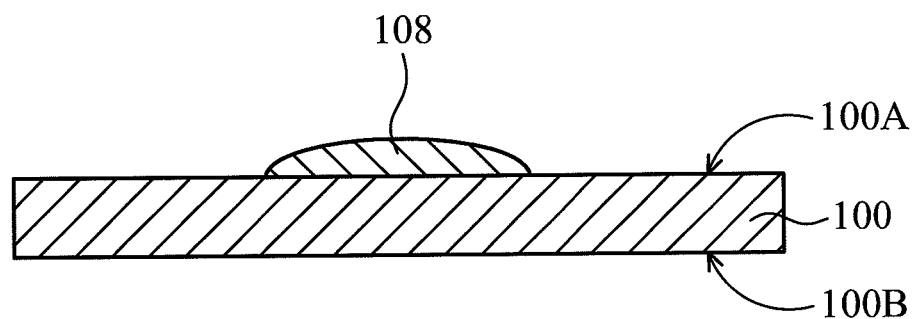
Figure 5F:
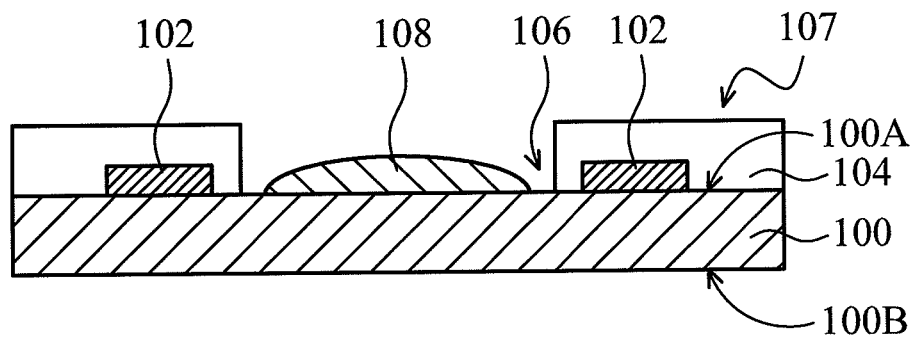

Referring to FIG. 5E, a transparent substrate 100, for example a glass substrate is provided. A lens 108 is formed on a surface 100A of the transparent substrate 100. Referring to FIG. 5D and FIG. 5F, the spacer 107 is stripped from the carrier 120 and then the spacer 107 is attached onto the surface 100A of the transparent substrate 100 to surround the lens 108 and form the lens structure 200a or 200c as shown in FIG. 4.

Further, another lens (not shown) may be formed on another surface 100B of the transparent substrate 100, and then another spacer (not shown) may be attached onto the surface 100B of the transparent substrate 100 to surround the lens to form another lens structure, for example the lens structure 200b or 200d as shown in FIG. 4.

Figure 6A:
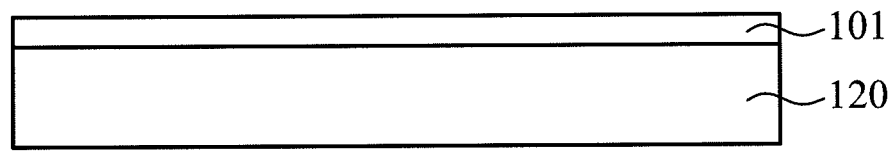
FIGS. 6A-6G show cross sections of intermediate stages of fabricating a lens structure according to an embodiment of the invention.

FIGS. 6A-6G show cross sections of intermediate stages of fabricating a lens structure 200d according to an embodiment of the invention. Referring to FIG. 6A, a carrier 120, for example a polymer film, is provided. A formed spacer can be stripped from the carrier 120. A dry film photoresist 101 is disposed on the carrier 120.

Figure 6B:
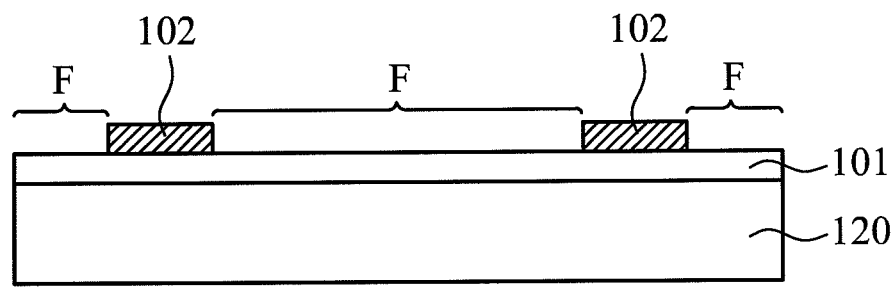

Referring to FIG. 6B, a material layer (not shown) of the base pattern 102 is disposed on the dry film photoresist 101. Then, the material layer of the base pattern 102 is patterned by an exposure and a development process to form the base pattern 102 on the dry film photoresist 101.

Figure 6C:
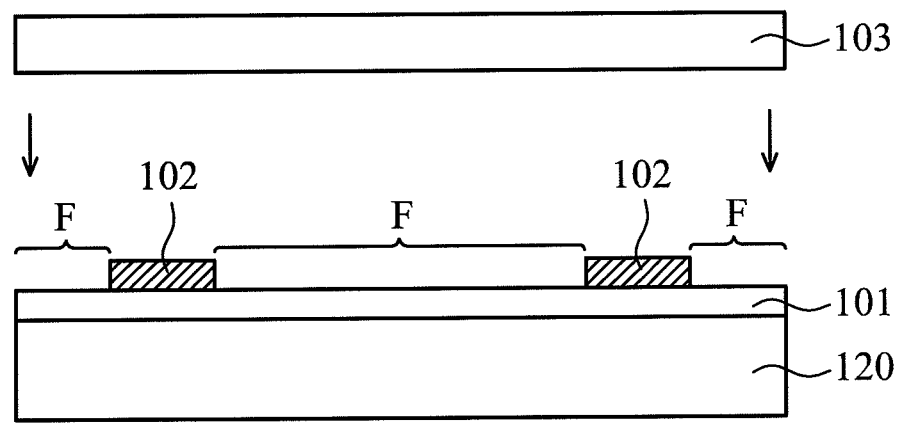

Referring to FIG. 6C, a dry film photoresist 103 is attached on the base pattern 102 and the dry film photoresist 101. In an embodiment, the material of the dry film photoresist 101, the material of the base pattern 102 and the material of the dry film photoresist 103 may be the same. In another embodiment, the material of the dry film photoresist 101, the material of the base pattern 102 and the material of the dry film photoresist 103 may be different form each other. In other embodiments, the material of the dry film photoresist 101 may be the same as the material of the dry film photoresist 103 and different from the material of the base pattern 102.

Figure 6D:
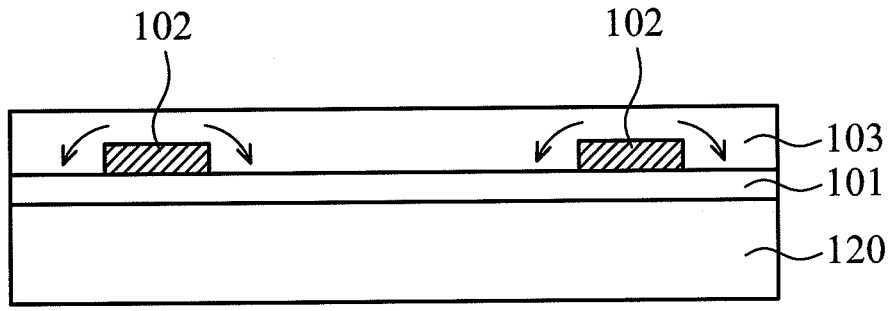

Referring to FIG. 6C and 6D, the dry film photoresist 103 is planarized by a lamination process. An exposed surface F of the dry film photoresist 101 for the lamination of the dry film photoresist 103 is shown in FIG. 6B.

Figure 6E:
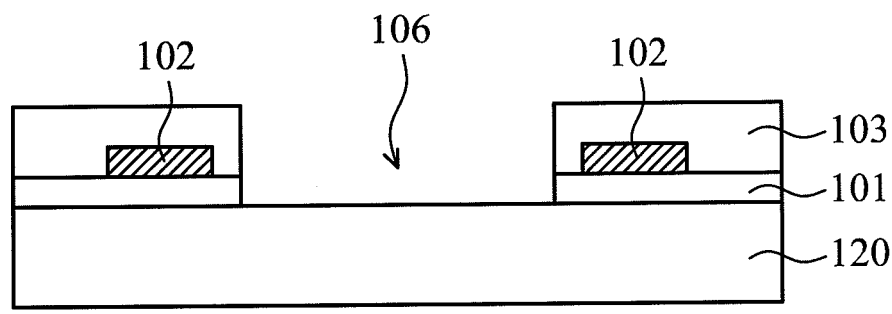

Referring to FIG. 6E, after the lamination process, the dry film photoresist 103 and the dry film photoresist 101 are patterned by an exposure and a development process to form a dry film photoresist pattern 104 and a dry film photoresist pattern 105 which have an opening 106 therein. The dry film photoresist pattern 104 covers the sidewalls and the top surface of the base pattern 102. The dry film photoresist pattern 105 is disposed under the base pattern 102. The dry film photoresist patterns 104 and 105 and the base pattern 102 are combined to form a spacer 109 of the lens structure 200d as shown in FIG. 4, wherein the height of the spacer 109 is adjustable. The base pattern 102 is embedded in the spacer 109.

Figure 6F:
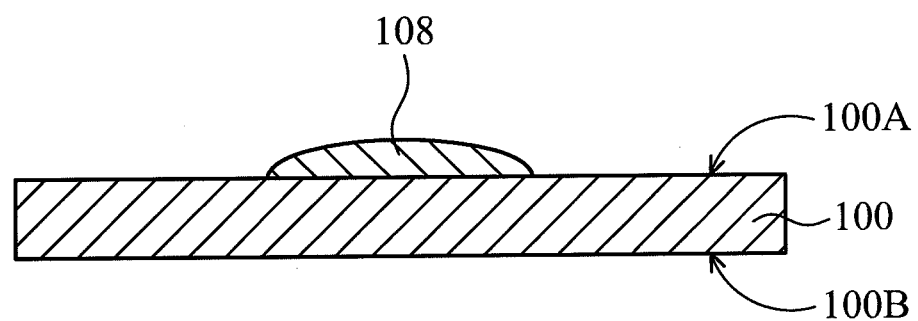
Figure 6G:
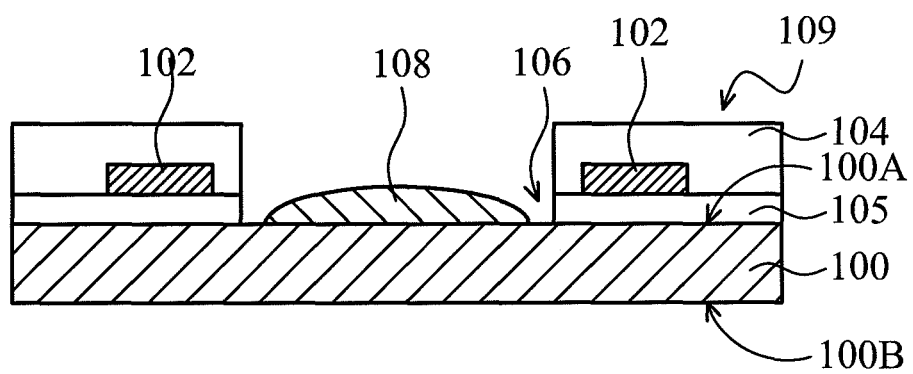

Referring to FIG. 6F, a transparent substrate 100, for example a glass substrate is provided. A lens 108 is formed on a surface 100A of the transparent substrate 100. Referring to FIG. 6E and FIG. 6G, the spacer 109 is stripped from the carrier 120 and then the spacer 109 is attached onto the surface 100A of the transparent substrate 100 to surround the lens 108 to form the lens structure 200d as shown in FIG. 4.

Moreover, before forming the lens structure 200d, another lens structure, for example the lens structure 200c as shown in FIG. 4 may be formed on another surface 100B of the transparent substrate 100.

In the embodiments of the invention, the spacer containing a base pattern therein may be disposed in a lens structure, for example the lens structure 200c of FIG. 4, which is bonded with another lens structure, for example the lens structure 200b of FIG. 4. Also, the spacer with a base pattern therein may be disposed in a lens structure, for example the lens structure 200a of FIG. 4, which is bonded with an image sensor device chip, for example the image sensor device chip 112 of FIG. 4.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A camera module, comprising:
a first lens structure, including:
    a first transparent substrate, having a first surface and a second surface opposite to the first surface;
    a first lens disposed on the first surface of the first transparent substrate; and
    a first spacer disposed on the first surface of the first transparent substrate, surrounding the first lens, wherein the first spacer includes a part having a first base pattern and a first dry film photoresist covering the part having the first base pattern, and the first dry film photoresist and the part having the first base pattern are materially different; and
an image sensor device chip disposed under the first lens structure;
the camera module further comprising:
a second lens structure disposed over the first lens structure, wherein the second lens structure includes:
    a second lens disposed on the second surface of the first transparent substrate; and a second spacer disposed on the second surface of the first transparent substrate, surrounding the second lens, wherein the second spacer includes a second dry film photoresist;

a third lens structure disposed over the second lens structure, wherein the third lens structure includes:

a second transparent substrate, having a third surface and a fourth surface opposite to the third surface;

a third lens disposed on the third surface of the second transparent substrate, facing the second lens; and a third spacer disposed on the third surface of the second transparent substrate, surrounding the third lens and bonding with the second spacer, wherein the third spacer includes a third dry film photoresist;

a fourth lens structure disposed over the third lens structure, wherein the fourth lens structure includes:

a fourth lens disposed on the fourth surface of the second transparent substrate; and a fourth spacer disposed on the fourth surface of the second transparent substrate, surrounding the fourth lens, wherein the fourth spacer includes a fourth dry film photoresist;

wherein the first lens is separated from the first spacer, the second lens is separated from the second spacer, the third lens is separated from the third spacer, the fourth lens is separated from the fourth spacer, and each of the lenses does not connect to the respective spacer.

2. The camera module as claimed in claim 1, wherein the first base pattern and the first dry film photoresist contact the first surface of the first transparent substrate.

3. The camera module as claimed in claim 1, wherein the first dry film photoresist embeds the first base pattern in the first spacer.

4. The camera module as claimed in claim 1, wherein the second spacer further includes a second base pattern covered with the second dry film photoresist.

5. The camera module as claimed in claim 1, wherein the second spacer further includes a second base pattern and the second dry film photoresist embeds the second base pattern in the second spacer.

6. The camera module as claimed in claim 1, wherein the third spacer further includes a third base pattern covered with the third dry film photoresist.

7. The camera module as claimed in claim 1, wherein the third spacer further includes a third base pattern and the third dry film photoresist embeds the third base pattern in the third spacer.

8. The camera module as claimed in claim 1, wherein the fourth spacer further includes a fourth base pattern covered with the fourth dry film photoresist.

9. The camera module as claimed in claim 1, wherein the fourth spacer further includes a fourth base pattern and the fourth dry film photoresist embeds the fourth base pattern in the fourth spacer.

10. The camera module as claimed in claim 1, wherein the first base pattern comprises a plurality of circular rings separated from each other.

* * * * *

UNITED STATES PATENT AND TRADEMARK OFFICE
CERTIFICATE OF CORRECTION

| | | |
|---|---|---|
| PATENT NO. | : 9,075,182 B2 | Page 1 of 1 |
| APPLICATION NO. | : 13/152690 | |
| DATED | : July 7, 2015 | |
| INVENTOR(S) | : Chieh-Yuan Cheng | |

It is certified that error appears in the above-identified patent and that said Letters Patent is hereby corrected as shown below:

Title page, item 73

Change the name of the first Assignee from "VisEra Technology Company Limited" to --VisEra Technologies Company Limited--.

Change the name of the second Assignee from "OmniVision Technologie, Inc." to --OmniVision Technologies, Inc.--.

Signed and Sealed this
Twelfth Day of January, 2016

Michelle K. Lee
*Director of the United States Patent and Trademark Office*